United States Patent [19]

Tu

[11] Patent Number: 5,308,794
[45] Date of Patent: May 3, 1994

[54] ALUMINUM-GERMANIUM ALLOYS FOR VLSI METALLIZATION

[75] Inventor: King-Ning Tu, Chappaqua, N.Y.

[73] Assignee: International Business Machines Corporation, Armonk, N.Y.

[21] Appl. No.: 108,781

[22] Filed: Aug. 18, 1993

Related U.S. Application Data

[63] Continuation of Ser. No. 876,335, Apr. 30, 1992, abandoned.

[51] Int. Cl.⁵ .......................................... H01L 21/44
[52] U.S. Cl. ................................... 437/194; 437/193; 437/197; 437/202
[58] Field of Search ............... 437/194, 197, 188, 193, 437/202, 52, 44, 45

[56] References Cited

U.S. PATENT DOCUMENTS

| | | | |
|---|---|---|---|
| 4,001,049 | 1/1977 | Baglin et al. | 437/173 |
| 4,507,157 | 3/1985 | Oliver, Jr. | 437/127 |
| 4,728,626 | 3/1988 | Tu | 437/133 |
| 4,989,064 | 1/1941 | Kubokoya et al. | 437/197 |
| 4,994,892 | 2/1991 | Zuleeg et al. | 257/766 |
| 5,001,108 | 3/1991 | Taguchi | 257/32 |
| 5,169,803 | 12/1992 | Miyakawa | 437/194 |

FOREIGN PATENT DOCUMENTS

| | | | |
|---|---|---|---|
| 62-293716 | 12/1987 | Japan | 437/194 |
| 2-84729 | 3/1990 | Japan | 437/194 |

Primary Examiner—Brian E. Hearn
Assistant Examiner—Kevin M. Picardat
Attorney, Agent, or Firm—Robert M. Trepp

[57] ABSTRACT

An apparatus and method for forming an interconnect through an opening or on an insulation layer with the coefficient of thermal expansion of the interconnect adjusted to reduce the thermal stress between the interconnect and the insulation layer is described incorporating the steps of forming a solid solution of a binary alloy including germanium and aluminum or a ternary alloy including aluminum, germanium and a third element, for example silicon, and forming a precipitate from the solid solution at a reduced temperature with respect to the temperature of forming the solid solution whereby the volume of the precipitate including germanium and the remaining solid solution is larger than the volume of the original solid solution.

26 Claims, 5 Drawing Sheets

ALUMINUM-GERMANIUM ALLOYS FOR VLSI METALLIZATION

This application is a continuation of application Ser. No. 07/876,335 filed Apr. 30, 1992.

FIELD OF THE INVENTION

This invention relates to very large scale integrated circuit chip metallization, and more particularly, to adjusting the thermal expansion of the interconnect metal to reduce the thermal stress of the interconnect metal with an insulation layer or opening in the insulation layer.

BACKGROUND OF THE INVENTION

In VLSI technology, multi-levels of metallization on silicon are used to increase the circuit density. Each layer of conducting lines are isolated by dielectric, for example, fused quartz, silicon dioxide or polymer layers, and the conducting lines on separate layers are interconnected by vias or studs. The composite structure must experience temperature excursion due to processing integration. Because of the difference in the thermal expansion coefficient between the interconnect metal, typically aluminum or aluminum-silicon, or aluminum-copper alloys, and the dielectric, thermal stress is induced. The thermal stress is a driving force for the low yield and low reliability of the device structure. The thermal stress can cause rupture, cracking or voiding by metal creep or deformation and results in electrical failures of opens and shorts.

One example of thermal stress would be a composite of aluminum lines on fused quartz first annealed at 400° C., and then cooled to 85° C. 400° C. is a typical processing temperature that the interconnect metallization may experience and 85° C. is a typical operating temperature of the interconnect metallization in the field. Since 400° C. is a relatively high temperature for atomic motion to occur in aluminum, the aluminum is relaxed and free of stress. The aluminum upon cooling, wants to shrink and is prevented from shrinking by the fused quartz, therefore, the aluminum after cooling is under tension. Since pure aluminum and fused quartz have respectively linear thermal expansion coefficient of $25 \times 10^{-6}/°C.$, and $0.5 \times 10^{-6}/°C.$, the linear thermal strain between a temperature excursion of 400° C. to 85° C. is expressed in equation 1.

$$\frac{\Delta l}{l} = \Delta\alpha\Delta T = 24.5 \times 10^{-6} \times 315 = 0.79\% \quad (1)$$

In equation 1, l is the total length of the metallization, $\delta l$ is the change in length of the metallization, $\Delta\alpha$ is the difference of the thermal expansion coefficient for the two materials, and $\Delta T$ is the temperature excursion in degrees Celsius.

In a metal solid, provided that shear motion by dislocation slip can occur, the elastic limit is about 0.2% strain, i.e., beyond that plastic deformation takes place.

In a publication by S. K. Groothuis, "Stress related failures causing open metallization", Rome Air Development Center Technical Report, RADC-TR-88-8 (1988), it was reported that VLSI metallization failures occur due to thermal stress between aluminum and $SiO_2$.

In certain semiconductor devices manufactured by a major manufacturer, void formation in aluminum studs was a prime reliability problem. In FIG. 1A, a cross-sectional view of a mis-aligned aluminum stud 10 on a contact 12 is shown-formed in opening 11 of fused quartz 18. Contact 12 is in ohmic contact with semiconductor region 22 in substrate 24 which may be, for example, silicon. Metallization layer 21 may be of titanium and is formed in opening 11 over a portion of contact 12 and insulation layer 23 of silicon nitride. Layer 23 is formed over layer 25 of silicon dioxide, which in turn is formed over substrate 24. A layer 28 of chronium is formed above layer 21 in opening 11. Due to the mis-alignment, a narrow neck 14 is formed above the contact 12 neighboring the mouse hole 15. Under thermal stress a void 16 can grow across narrow neck 14 resulting in an open 17. The strain in the stud 10 is large due the fact that it is surrounded by quartz 18 which functions as an insulator. While improvement of the alignment of stud 10 to contact 12 will increase device lifetime, the key failures is due to the thermal stress in the metallization interconnects, for example, stud 10 and aluminum metallization lead 20. There is therefore a recognized need to reduce the thermal stress by providing a better match of the thermal expansion coefficient of the dielectric and the interconnect metallization.

Certain alloys have been formulated for the electrical industry which have various selected thermal expansion coefficients, for example, KOVAR, a trademark of Westinghouse Electric Corp., and INVAR, a trademark of Imphy S.A., French company.

In U.S. Pat. No. 2,877,147 which issued Mar. 10, 1959 to C. D. Thurmond, a description is given of alloyed connections to semiconductor bodies which contain, as a minor ingredient, the same basic semiconductor material as the body.

In U.S. Pat. No. 3,222,630 which issued on Dec. 7, 1965 to L. V. Gorman, aluminum-germanium alloys in the eutectic range for use as contact materials to semiconductor materials is described. A semiconductor body may have a contact material comprising an alloy containing 52-56% by weight germanium with the remainder aluminum. A gold lead wire may be pressed against the contact material causing the gold lead wire to alloy with the germanium in the contact material.

U.S. Pat. No. 3,620,837 which issued on Nov. 16, 1971 to J. Leff et al., a method is described for improving the reliability of aluminum and/or aluminum alloy lands on semiconductor integrated circuits by vapor depositing aluminum or an aluminum alloy onto a semiconductor substrate which is at a temperature between 320° and 570° C. The total thickness of the deposited aluminum or aluminum alloy is between 5,000 and 25,000. Å.

In U.S. Pat. No. 3,925,808 which issued on Dec. 9, 1975 to P. Rai-Choudhury, a silicon semiconductor device and, in particular, a high power silicon semiconductor device is described with stress-free electrodes. An electrode is formed at at least one major surface of a silicon body of a given impurity region with a solder material selected from the group consisting of aluminum, aluminum-silicon alloy, aluminum-geranium alloy, and germanium doped to >about $1 \times 10^{19}$ atoms/$cm^3$ therethrough. The solder material is contacted with a degenerate silicon electrode having an impurity concentration therethrough >about $1 \times 10^{19}$ atoms/$cm^3$ and preferably >$1 \times 10^{20}$ atoms/$cm^3$. By this arrangement, the silicon body can be mounted on and bonded to the electrode forming an ohmic contact without short circuiting the device. The assembly is heated preferably to a temperature greater than 675° C. in a hydrogen atmosphere to alloy the electrode to the silicon body through a solder layer formed from the solder material. Preferably, the solder material is a silicon eutectic alloy, e.g., aluminum-11.7% by weight silicon, so that the silicon of the solder layer is obtained primarily from the solder material.

In U.S. Pat. No. 4,672,740 which issued on Jun. 16, 1987 to K. Shirai et al., a semiconductor device is described having contact windows between an aluminum or aluminum-alloy wiring layer and a diffused region in the semiconductor substrate. The contacts are formed by using a barrier film of a refractory metal silicide, for example molybdenum silicide, between the wiring layer and the diffused region. The wiring layer may be an aluminum-silicon alloy (1% silicon) deposited to a thickness of approximately 1 µm.

SUMMARY OF THE INVENTION

In accordance with the present invention, an apparatus and method for forming an interconnect metallization on or through an opening in an insulation layer with the coefficient of thermal expansion of the interconnect adjusted to reduce the thermal stress of the interconnect with the insulation layer is described comprising the steps of depositing aluminum on or in the opening of the insulation layer, depositing germanium on or in the opening of the insulation layer, raising the temperature of the aluminum and germanium to a first temperature which is below the melting point of aluminum for a first period of time to allow the germanium to diffuse through the aluminum to provide a solid solution of germanium in the aluminum of greater than a first atomic percent, and lowering the temperature of the aluminum and germanium to a second temperature for a second period of time to allow a portion of germanium to precipitate out of the solid solution whereby the volume of the precipitated germanium and alloy remaining is larger than at times the germanium is in solid solution in the aluminum.

It is an object of the invention to prevent the formation of voids in aluminum studs, vertical riser connections, between layers of patterned aluminum metallization wherein the aluminum studs have surfaces contiguous with fused quartz, silicon dioxide, or polymer.

It is a further object of the invention to dissolve germanium up to 2.8 atomic percent into aluminum at 424° C.

It is a further object of the invention to reduce the temperature of a solution of aluminum-germanium whereby germanium atoms precipitate out and form a diamond structure in a separate phase.

It is a further object of the invention to form a solution of aluminum-germanium at about two atomic percent germanium at 400° C. and to precipitate the germanium out of solution to form a diamond structure at about 300° C. whereby the solubility of germanium in aluminum is only 0.5 atomic percent.

It is a further object of the invention to increase the solubility of germanium in aluminum by forming a ternary alloy of aluminum-germanium-silicon. A ternary alloy of aluminum-germanium-silicon will have a higher solubility of both germanium and silicon than their binary alloys, respectively.

It is a further object of the invention to dissolve silicon into aluminum along with germanium whereby germanium, as well as silicon, precipitate out in a diamond structure.

It is a further object of the invention to form an aluminum-germanium-silicon ternary alloy and to precipitate out of solution a phase which may be a mixture of germanium and silicon, a germanium silicon alloy, or an amorphous germanium silicon phase; in either event, the volume change from solution to precipitate is about the same.

It is a further object of the invention, to dissolve and precipitate out germanium from an aluminum alloy metallization which may contain a small amount of copper or hafnium or other transition metals for electromigration reduction. These metallic elements, however, will not influence the precipitation of germanium and silicon, since the binding energy between the transition metals and aluminum is stronger.

It is a further object of the invention to introduce germanium and silicon into aluminum metallization by co-deposition, sputtering from a target of $Ge_xSi$ where x can vary from 10 to 1 or by layers of germanium and silicon adjacent the aluminum metallization.

It is a further object of the invention that while dissolving germanium and silicon into aluminum metallization, the solubility of germanium in aluminum may be increased by more than 1%.

BRIEF DESCRIPTION OF THE DRAWING

These and other features, objects, and advantages of the present invention will become apparent upon a consideration of the following detailed description of the invention when read in conjunction with the drawing, in which.

DESCRIPTION OF THE PREFERRED EMBODIMENT

Figure 1A:
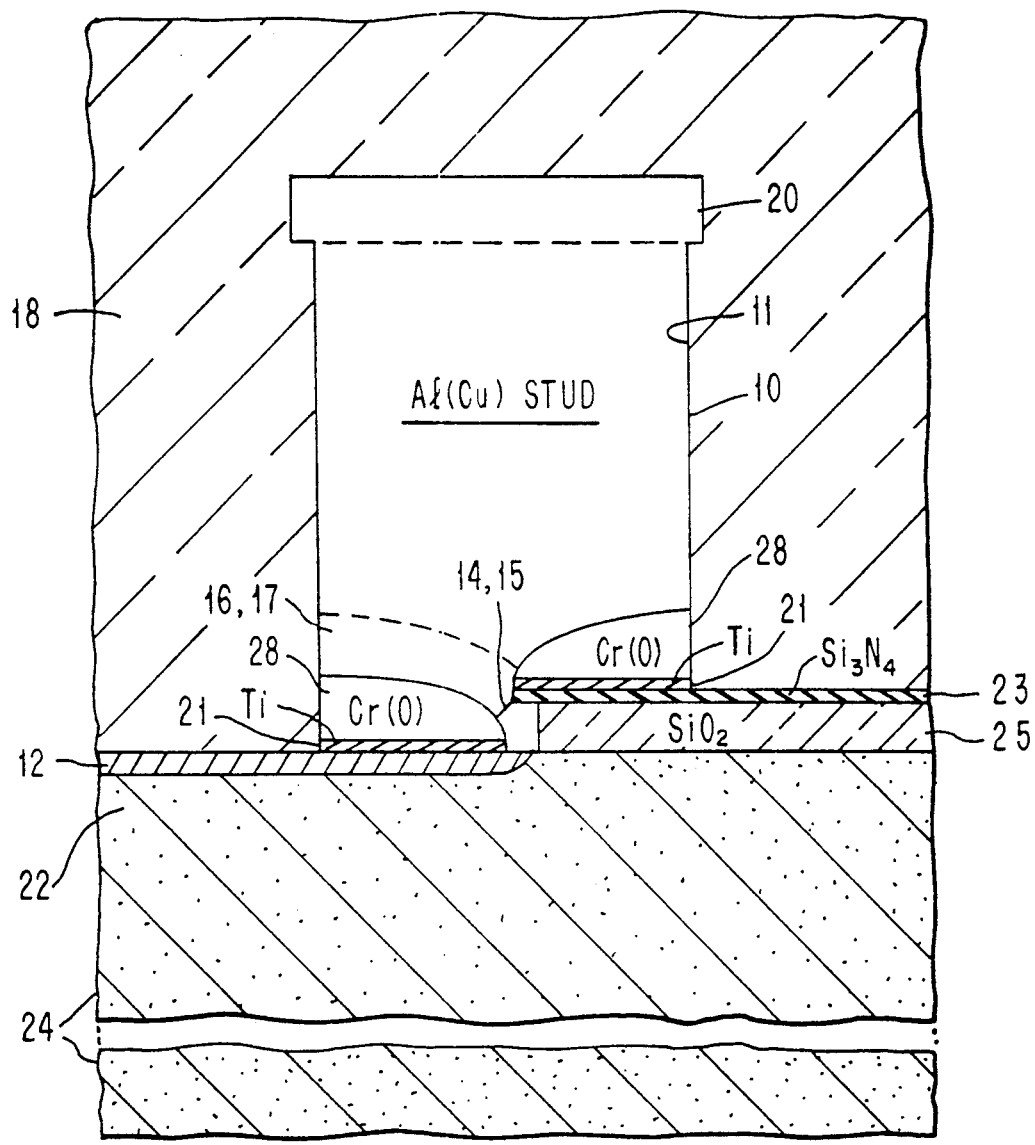
FIG. 1A is a cross-section view of a prior art wiring structure on a semiconductor device.
Figure 1B:
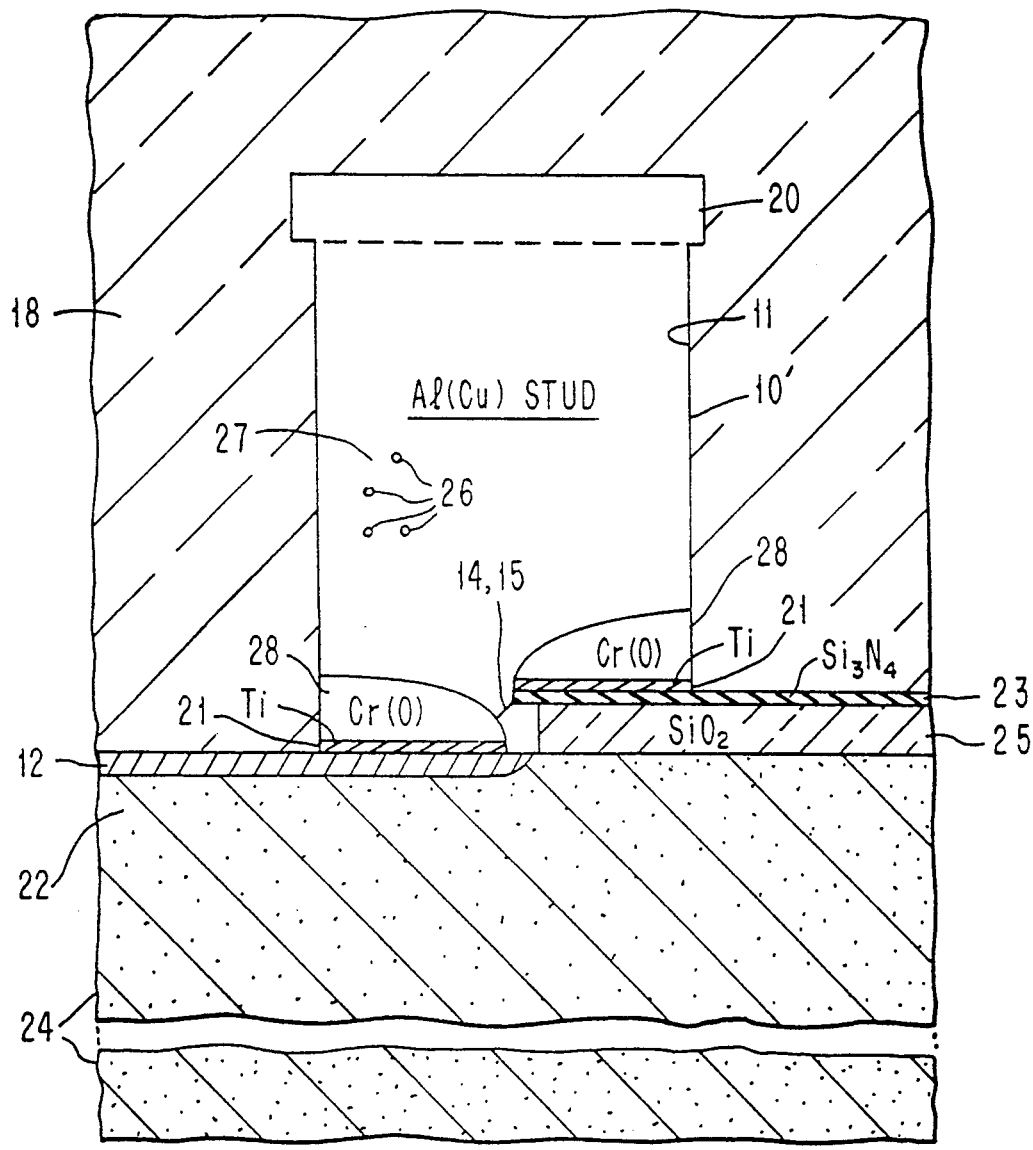
FIG. 1B is a cross-section view of one embodiment of the invention.

Referring now to the drawing, and in particular FIG. 1B, a cross-section view of a wiring structure on a semiconductor device contact 12 is shown. In FIG. 1B like references are used for structures corresponding to the apparatus of FIG. 1A. Stud 10' was initially formed by filling an opening 11 in fused quartz 18. If stud 10 is composed of aluminum or aluminum-copper as shown in FIG. 1A, the structure is of the prior art. However, if stud 10' is formed of aluminum-germanium wherein a portion of the germanium has precipitated out into a separate phase of diamond structure as shown in FIG. 1B, then stud 10' is an example of the invention herein. A metallization layer shown by lead 20 makes ohmic contact with the upper portion of stud 10'. The lower portion of stud 10' may contact another metallization line or a contact 12 consisting of platinum silicide by way of a metallization layer 21 of titanium. Platinum silicide contact 12 is in ohmic contact with the semiconductor region 22 below. Semiconductor region 22 may be part of a substrate 24 which may be, for example, silicon. The germanium precipitate 26 is shown in stud 10' which comprises substantially 97% or more of aluminum or aluminum alloy 27. As can be seen in FIG. 1, the aluminum stud 10 with the aluminum alloy 27 and precipitate 26 and the aluminum line 20 is surrounded and contiguous with fused quartz 18 which may also be silicon dioxide or a polymer. The fused quartz 18 may be deposited at a temperature of 400° C. over several hours of time, for example 10 hours. In normal operation, the embodiment of FIG. 1 may operate in 85° C. and be stored at a room temperature of 23° C. Thus, a temperature excursion from 400° to 85° occur subsequent to forming of the top layer of fused quartz 18, a change of temperature of 315° C.

Figure 2:
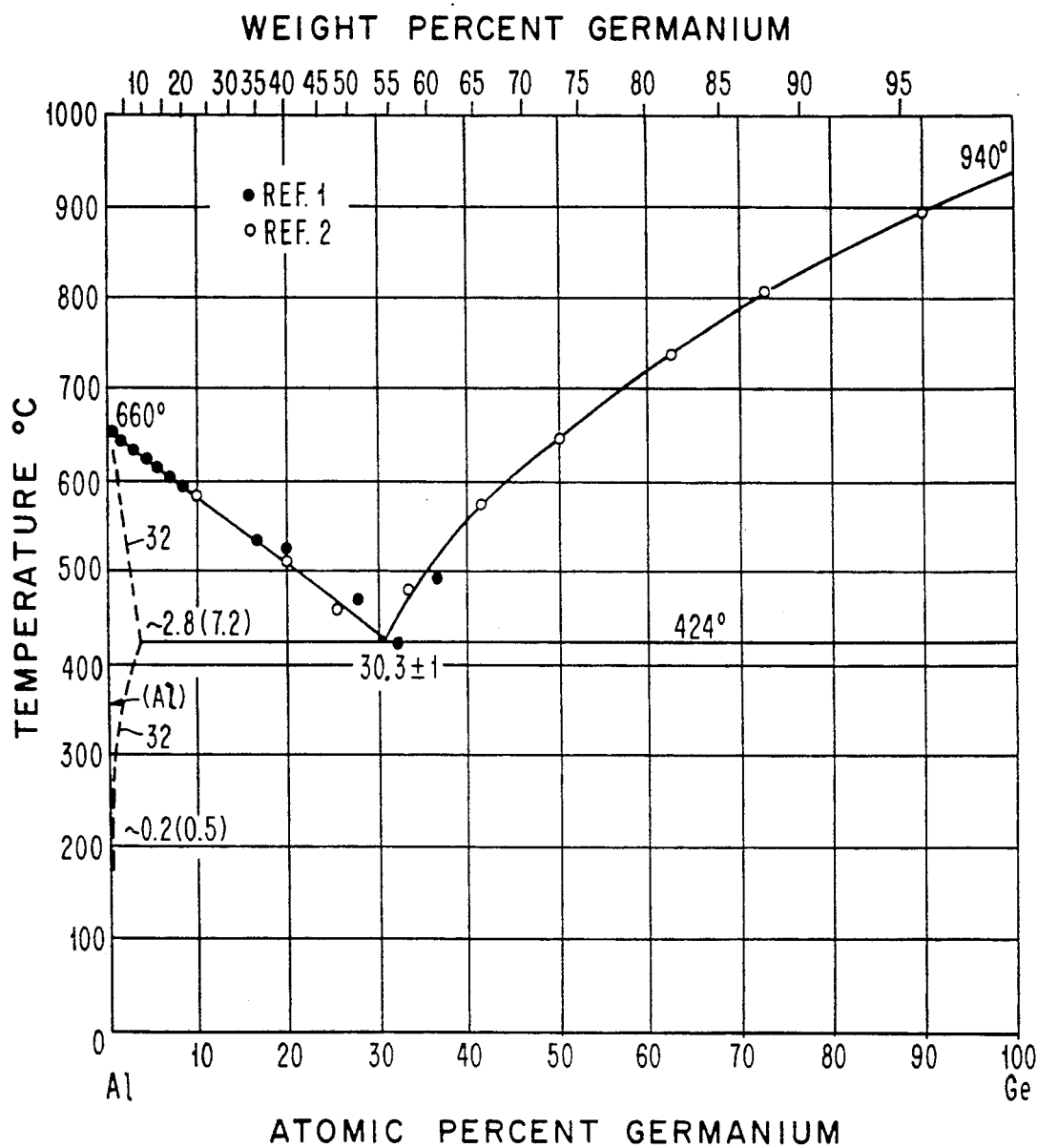
FIG. 2 is a phase diagram of aluminum-germanium.

FIG. 2 is a phase diagram of aluminum-germanium. In FIG. 2 the ordinate represents temperature in degrees Celsius and the abscissa represents atomic percent of germanium in aluminum. In FIG. 2, the portion to the left of curve 32 shows the area where a solid solution of aluminum and germanium may be formed. For example, at 424° C., 2.8 atomic percent germanium may be dissolved into aluminum. At 400° C., 2 atomic percent germanium may be dissolved into aluminum. The dissolution of germanium into aluminum is a substitutional position of germanium in place of aluminum. The crystal structure of a solution of germanium in aluminum is face centered cubic and has a crystal lattice spacing of 4.04 Å. The volume represented by each aluminum or germanium atom is represented by $\frac{1}{4} \times (4.04 \text{ Å})^3$ which equals 16.5 Å$^3$. As can be seen by curve 32, as the temperature of the solution is reduced from 424° C. lower, the maximum amount of solubility of germanium decreases. The germanium atoms upon cooling precipitate out and form a diamond structure. Each germanium atom occupies in the diamond structure, a volume of $\frac{1}{8} \times (5.65 \text{ Å})^3$ which equals 22.5 Å$^3$. The lattice parameter of the diamond structure is 5.65 Å. Thus, there is an increase in volume from 16.5 Å$^3$ to 22.5 Å$^3$ which is 6.1 Å$^3$ for each germanium atom when the germanium atom precipitates out from the aluminum-germanium solid solution.

As may be seen from curve 32 in FIG. 2, at 300° C., the germanium solubility in aluminum is only 0.5 atomic percent. At 200° C., the solubility is 0.2 atomic percent of germanium in aluminum. Below 200° C. the solubility of germanium in aluminum is negligible.

If 2% of germanium precipitates out from a solid solution of aluminum and germanium, then prior to any precipitation, the total volume of the solution for 100 atoms would be 100×16.5 angstroms$^3$ which equals 1650 Å$^3$. Upon precipitation of 2% of the germanium, 98 atoms would occupy a volume of 1617 Å$^2$ and 2 atoms of germanium would occupy a volume of 45 Å$^2$ for a total volume of 1662 Å$^3$. The increase in volume is 0.727%. It is noted that the elastic limit of the solid solution is about 0.2% strain. Increases of strain beyond the 0.2% result in plastic deformation of the solid solution.

If 2.8% of germanium in a solid solution of germanium and aluminum precipitates from the solid solution, the increase in volume is 1.02%.

It is noted that the dissolution of germanium into aluminum at high temperatures such as 400° C. is not a problem since atomic lattice diffusion is fast at that temperature. However, upon cooling the solid solution, the precipitation of germanium from the solid solution to form a diamond structure may not be fast, but in fact, may be slow. However, from curve 32 in FIG. 2, at 300° the germanium solubility is only 0.5 atomic percent.

Therefore, after dissolving germanium in aluminum at 400° C., the temperature may be lowered to 300° C. where more than 75% of the germanium will precipitate out.

The rate of precipitation will depend on the lattice diffusion of germanium in aluminum, which will be close to that of self-diffusion of aluminum where the diffusion D is expressed in equation 2.

$$D = 0.047 \times e^{(-1.28 \, ev/kT)} \tag{2}$$

At 300° C., the diffusion constant D is equal to $4.7 \times 10^{-13}$ cm$^2$/sec which means that in 30 minutes (1800 seconds), germanium atoms can diffuse a distance of 3,000 Å. If the layer thickness of metallization or the diameter of vertical risers or studs connecting metallization layers have a thickness of the layer or a radius of the stud of 5,000 Å and wherein the grain size in the stud is about 0.5 to 1 micrometers, the step of annealing at 300° centigrade for 1,800 seconds is sufficient for the precipitation of germanium. On the other hand, if germanium can precipitate by homogeneous nucleation within aluminum grains, a much shorter diffusion distance is required to dissolve germanium, and in turn a much lower temperature may be used during precipitation of germanium. The homogeneous nucleation within the aluminum grains can also be assisted by some additional solutes such as copper and hafnium in the aluminum.

Figure 3:
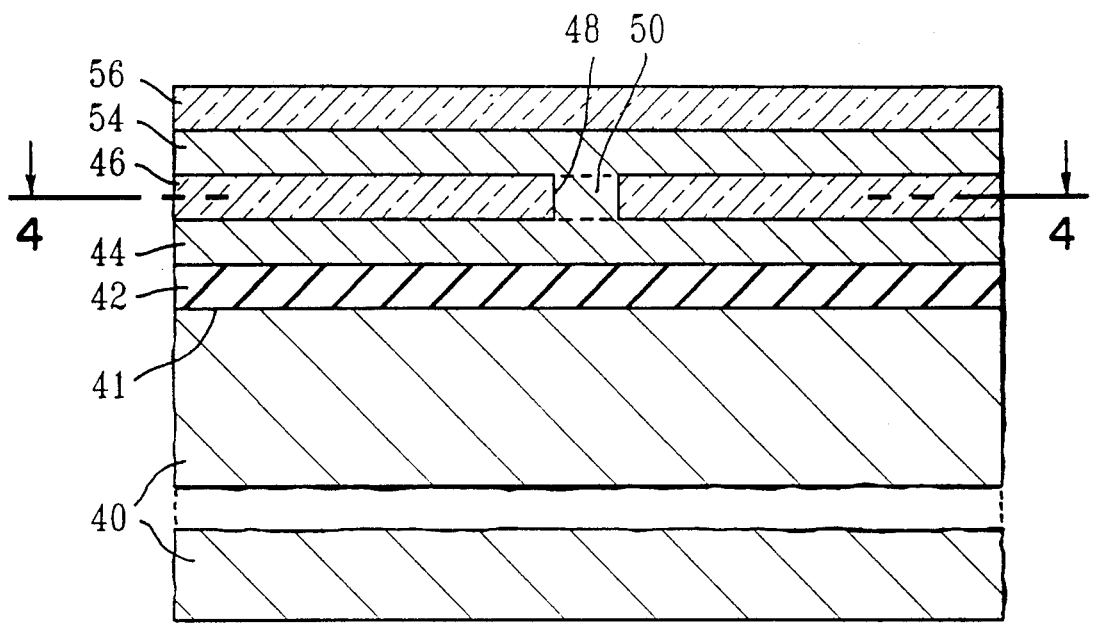
FIG. 3 is a cross-section view of a second embodiment of the invention.

FIG. 3 is a cross-section view of one embodiment of the invention. A substrate 40 which may be, for example silicon, has a major surface 41 with a layer 42 of dielectric material, an insulator, formed thereover. A layer of metallization 44 is formed on layer 42. Metallization layer 44 may be patterned to provide interconnections which is well known in the art. Layer 44 may include aluminum with germanium therein to form a solid solution prior to the germanium being precipitated out as a separate phase, i.e., in a diamond structure. Above layer 44 is layer 46 of dielectric which may be, for example, fused quartz deposited at 400° C., silicon dioxide or a polymer. An opening 48 may be formed in dielectric layer 46 which may subsequently be filled with metallization to form a stud 50 making ohmic contact to metallization layer 44.

Figure 4:
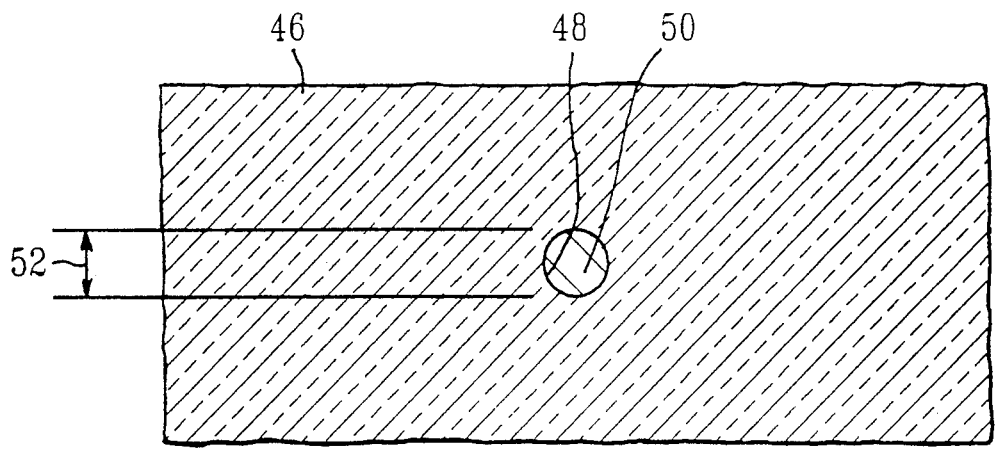
FIG. 4 is a cross-section view along the lines 4—4 of FIG. 3.

FIG. 4 is a cross-section view along the lines 4—4 of FIG. 3. In FIG. 4, a cross-section of dielectric layer 46 is shown passing through opening 48 which is shown to be round with stud 50 filling the opening. The diameter of the opening 48 and of stud 50 is shown by arrow 52. Other cross-sectional geometries for stud 50 such as rectangular, square, oblong, etc. may be used in place of a circular cross-section. Stud 50 functions to provide a low ohmic contact between metallization layer 44 and metallization layer 54 shown in FIG. 3. Metallization layer 54 is formed on dielectric layer 46 and stud 10 and may be patterned to provide interconnections on the layer which are well known in the art. A dielectric layer 56 may be formed over metallization layer 54. As shown in FIG. 3 by layers 42, 44, 46, 54 and 56, additional metallization layers and dielectric layers may be stacked one upon the other above dielectric layer 56 with appropriate openings and studs positioned in the respective dielectric layers to provide interconnections between the metallization layers. Dielectric layer 56 may be, for example, fused quartz, silicon dioxide, or a polymer and functions to electrically insulate the metallization of metallization layer 54.

The composition of metallization layers 44 and 54 and stud 50 may be formed by interfacial interdiffusion of germanium into aluminum at 300° C. to 400° C. or by direct electron beam co-deposition or by sputtering. By electron beam co-deposition or sputtering, a higher percentage of germanium can be added to aluminum and some excess amount of germanium will enhance nucleation of elemental germanium grains.

As may be seen from FIG. 2, curve 32, the solubility of germanium into aluminum is limited to 2.8 atomic percent at the eutectic temperature of 424° C. However, if a ternary alloy is formed including aluminum, germanium, and a third element, a higher solubility of germanium in aluminum may be obtained of both germanium and a third element than may be obtained by their binary alloys, respectively. A higher solubility of germanium in aluminum will give a larger volume increase upon the precipitation of more germanium at lower temperatures.

Figure 5:
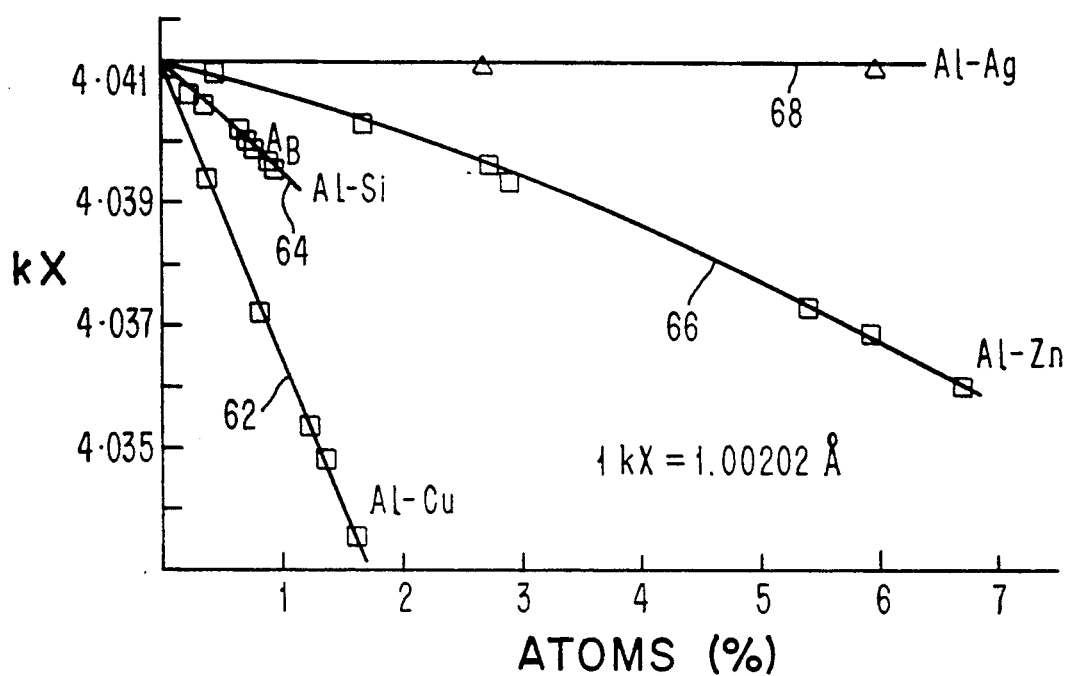
FIGS. 5 and 6 show curves of the lattice parameter change as a function of the binary alloy composition.
Figure 6:
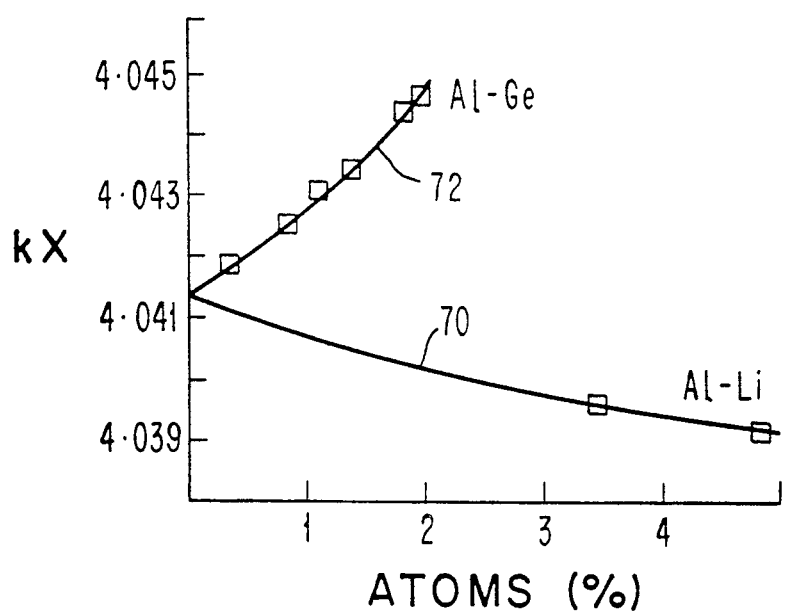

FIGS. 5 and 6 show curves of the lattice parameter change as a function of several elements respectively dissolved in aluminum to form binary alloys. In FIGS. 5 and 6, the ordinate represents the lattice parameter in angstroms and the abscissa represents atomic percent of the element dissolved in aluminum. In FIG. 5, curve 62 shows a decrease in the lattice parameter with an increase in the atomic percent of copper dissolved in aluminum. Curve 64 shows a decrease in the lattice parameter for an increase in the atomic percent of silicon dissolved in aluminum. Curve 66 shows a decrease in the lattice parameter with an increase in the atomic percent of zinc dissolved in aluminum. Curve 68 shows no change in the lattice parameter for an increase in the atomic percent of silver dissolved in aluminum.

In FIG. 6, curve 70 shows a decrease in the lattice parameter for an increase in atomic percent of lithium dissolved in aluminum. Curve 72 shows an increase in the lattice parameter for an increase in the atomic percent of germanium. From curve 64 shown in FIG. 5, and curve 72 shown in FIG. 6, it may be seen that silicon decreases the aluminum alloy lattice parameter while germanium increases the aluminum alloy lattice parameter. By the DARKEN-GURRAY rule of the relation between solid solubility and lattice parameter difference, a ternary aluminum-germanium-silicon solid solution will have a higher solubility of both germanium and silicon than their respective binary alloys. It is an advantage to have both a higher solubility of silicon, as well as germanium, since silicon, as well as germanium, precipitates out of solution to form a diamond structure, thereby resulting in an increase in volume.

In an aluminum-germanium-silicon ternary alloy, the precipitated phase may be a mixture of germanium and silicon or a germanium silicon alloy, or even an amorphous germanium silicon phase, their volume change from solution to a precipitate being about the same. The aluminum alloy interconnect metallization may also contain a small amount of copper or hafnium or other transition metals for electromigration reduction. Copper or hafnium will not influence very much the precipitation of germanium and/or silicon, since the binding energy between copper and hafnium and aluminum is stronger.

Introduction of germanium and silicon into aluminum may be achieved by co-deposition, sputtering from a target of $Ge_xSi$ where x can vary from 10 to 1 or by deposition of respective layers of germanium and silicon, one layer being contiguous with aluminum followed by layer-reaction. It is expected that germanium and silicon may increase their respective solubility by more than 1 atomic percent in aluminum as a ternary alloy. From a strain reduction viewpoint, the added volume of precipitation of germanium and silicon in the aluminum alloy is significant due to the original increase of solubility of germanium and silicon.

There is thus provided a new and improved method for forming interconnect metallization for semiconductor devices. Utilizing an interconnect alloy which may provide a precipitated phase upon cooling to increase the volume of the interconnect metallization to provide an adjustment of the thermal expansion coefficient of the interconnect metallization to more closely match that of an insulation layer such as fused quartz, silicon dioxide or a polymer.

The present invention has particular application in the manufacturing of semiconductor devices, including bipolar, FET, and CMOS devices, and is particularly useful with very large scale integrated circuits (VLSI) requiring multiple levels of wiring to contact densely-packed devices.

While the present invention has been shown and described with respect to specific embodiments and/or specific methods, it is not thus limited. Numerous modifications, changes, and improvements will occur which fall within the spirit and scope of the invention.

Having thus described my invention, what I claim as new and desire to secure by Letters Patents is:

1. A method for forming an interconnect through an opening in an insulation layer comprising the steps of:
   depositing aluminum in said opening,
   depositing germanium in said opening with said aluminum,
   raising the temperature of said aluminum and said germanium to a first temperature which is below the melting point of aluminum for a first period of time to allow said germanium to diffuse through said aluminum to provide a volume of a first solid solution of germanium in said aluminum of greater than a first atomic percent number, and
   lowering the temperature of said aluminum and said germanium to a second temperature for a second period of time to allow a portion of said germanium to precipitate out of said first solid solution whereby the total volume of said precipitated germanium and the remaining solid solution is larger than said volume of said first solid solution.

2. The method of claim 1 further including the step of depositing a third element in said opening with said aluminum and germanium prior to said step of raising the temperature.

3. The method of claim 2 wherein said step of depositing a third element includes the step of selecting an element for depositing from the group consisting of copper, lithium, silicon and zinc.

4. The method of claim 1 wherein said step of raising the temperature includes the step of raising the temperature to a temperature in the range from 360° C. to 440° C.

5. The method of claim 1 wherein said step of lowering the temperature includes the step of lowering the temperature to said second temperature wherein said second temperature is in the range from 270° C., to 330° C.

6. The method of claim 1 wherein said steps of depositing aluminum and depositing germanium are carried out concurrently.

7. The method of claim 2 wherein said steps of depositing aluminum, depositing germanium and depositing a third element are carried out concurrently.

8. The method of claim 1 wherein said steps of depositing aluminum and depositing germanium are selected from the group consisting of direct electron-beam deposition and sputtering.

9. The method of claim 1 wherein said step of raising the temperature includes the step of selecting a first atomic percent number and dissolving said germanium to said selected first atomic percent number whereby the coefficient of thermal expansion of said interconnect is adjusted by said precipitated germanium to reduce the thermal stress between said interconnect and said insulation layer.

10. The method of claim 1 wherein said step of depositing aluminum includes the step of forming a layer of aluminum.

11. The method of claim 1 wherein said step of depositing germanium includes the step of forming a layer of germanium.

12. The method of claim 2 wherein said step of depositing a third element includes the step of forming a layer of said third element.

13. The method of claim 1 wherein said step of depositing germanium includes the step of depositing germanium and silicon.

14. A method for forming an interconnect in contact with an insulation layer comprising the steps of:
depositing aluminum over said insulation,
depositing germanium adjacent said aluminum,
raising the temperature of said aluminum and germanium to a first temperature which is below the melting point of aluminum for a first period of time to allow said germanium to diffuse through said aluminum to provide a first solid solution of germanium in said aluminum of greater than a first atomic percent number, and
lowering the temperature of said aluminum and germanium to a second temperature for a second period of time to allow a portion of said germanium to precipitate out of said solid solution whereby the volume of the precipitated germanium and the remaining solid solution is larger than the volume of said first solid solution.

15. The method of claim 14 further including the step of depositing a third element adjacent said aluminum and germanium prior to the step of raising the temperature.

16. The method of claim 15 wherein said step of depositing a third element includes the step of selecting an element for depositing from the group consisting of copper, lithium, silicon and zinc.

17. The method of claim 14 wherein said step of raising the temperature includes the step of raising the temperature to said first temperature wherein said first temperature is in the range from 360° C. to 440° C.

18. The method of claim 14 wherein said step of lowering the temperature includes the step of lowering the temperature to said second temperature wherein said second temperature is in the range from 270° C. to 330° C.

19. The method of claim 14 wherein said steps of depositing aluminum and depositing germanium are carried out concurrently.

20. The method of claim 15 wherein said steps of depositing aluminum, depositing germanium and depositing a third element are carried out concurrently.

21. The method of claim 14 wherein said steps of depositing aluminum and depositing germanium are selected from the group consisting of direct electron-beam deposition and sputtering.

22. The method of claim 14 wherein said step of raising the temperature includes the step of selecting a first atomic percent number and dissolving said germanium to said selected first atomic percent number whereby the coefficient of thermal expansion of said interconnect is adjusted by said precipitated germanium to reduce the thermal stress between said interconnect and said insulation layer.

23. The method of claim 14 wherein said step of depositing aluminum includes the step of forming a layer of aluminum.

24. The method of claim 14 wherein said step of depositing germanium includes the step of forming a layer of germanium.

25. The method of claim 15 wherein said step of depositing a third element includes the step of forming a layer of said third element.

26. The method of claim 14 wherein said step of depositing germanium includes the step of depositing germanium and silicon.

* * * * *